United States Patent
Yoo et al.

(10) Patent No.: US 10,056,479 B2
(45) Date of Patent: Aug. 21, 2018

(54) SEMICONDUCTOR DEVICE

(71) Applicant: SAMSUNG ELECTRONICS CO., LTD., Suwon-si, Gyeonggi-Do (KR)

(72) Inventors: Jae-Hyun Yoo, Suwon-si (KR); Jin-Hyun Noh, Seoul (KR); Kee-Moon Chun, Seongnam-si (KR); Jong-Sung Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 80 days.

(21) Appl. No.: 14/993,108

(22) Filed: Jan. 12, 2016

(65) Prior Publication Data

US 2016/0225896 A1 Aug. 4, 2016

(30) Foreign Application Priority Data

Jan. 29, 2015 (KR) ........................ 10-2015-0014287

(51) Int. Cl.
*H01L 29/78* (2006.01)
*H01L 29/06* (2006.01)
*H01L 29/165* (2006.01)

(52) U.S. Cl.
CPC ........ *H01L 29/7816* (2013.01); *H01L 29/063* (2013.01); *H01L 29/0619* (2013.01); *H01L 29/7835* (2013.01); *H01L 29/7848* (2013.01); *H01L 29/7851* (2013.01); *H01L 29/165* (2013.01)

(58) Field of Classification Search
CPC ........... H01L 21/28273; H01L 29/0619; H01L 29/7816
See application file for complete search history.

(56) References Cited

U.S. PATENT DOCUMENTS

| 6,906,381 B2 | 6/2005 | Peyre-Lavigne et al. |
| 8,710,587 B2 | 4/2014 | Moon et al. |
| 8,779,517 B2 | 7/2014 | Lin et al. |

(Continued)

FOREIGN PATENT DOCUMENTS

| JP | 07-135307 | 5/1995 |
| KR | 0272174 | 8/2000 |

(Continued)

*Primary Examiner* — Marc Armand
(74) *Attorney, Agent, or Firm* — Volentine, Whitt & Francos, PLLC

(57) ABSTRACT

A semiconductor device has reduced ON resistance (Ron) as well as a reduced electric field emanating from a current path. The semiconductor device includes a fin pattern, a gate electrode intersecting the fin pattern, a source region which has a first conductivity type and is disposed on one side of the gate electrode, a body region which has a second conductivity type, is situated within the fin pattern under the source region, and extends in a loop around the source region, a drain region which has the first conductivity type and is disposed on the other side of the gate electrode, a field dispersion region which has the second conductivity type and is situated within the fin pattern between the gate electrode and the drain region, and a drift region which has the first conductivity type, is situated within the fin pattern under the drain region and the field dispersion region, and extends in a loop around the drain region and the field dispersion region.

5 Claims, 21 Drawing Sheets

(56) References Cited

U.S. PATENT DOCUMENTS

| | | | |
|---|---|---|---|
| 8,853,015 B1* | 10/2014 | Kuo | H01L 21/76224 257/347 |
| 2002/0105025 A1* | 8/2002 | Fujihira | H01L 29/0619 257/328 |
| 2003/0025154 A1 | 2/2003 | Haynie | |
| 2005/0266638 A1* | 12/2005 | Cho | H01L 21/28273 438/257 |
| 2012/0139041 A1* | 6/2012 | Su | H01L 21/76202 257/339 |
| 2014/0145265 A1 | 5/2014 | Shrivastava et al. | |
| 2016/0181358 A1* | 6/2016 | Zhang | H01L 29/66689 257/339 |

FOREIGN PATENT DOCUMENTS

| | | |
|---|---|---|
| KR | 2007-0071030 A | 7/2007 |
| KR | 2011-0078621 A | 7/2011 |
| KR | 1180501 | 8/2012 |

\* cited by examiner

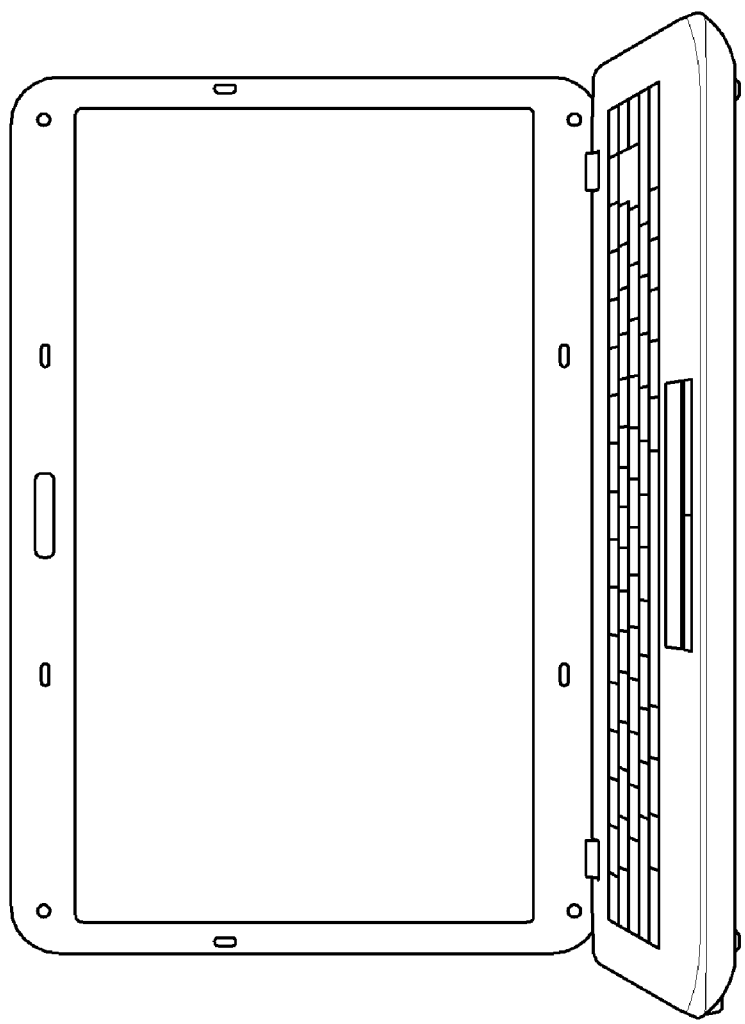

SEMICONDUCTOR DEVICE

This application claims priority from Korean Patent Application No. 10-2015-0014287 filed on Jan. 29, 2015 in the Korean Intellectual Property Office, the disclosure of which is hereby incorporated by reference in its entirety.

BACKGROUND

1. Field of the Inventive Concept

The present inventive concept relates to a semiconductor device. More particularly, the inventive concept relates to a semiconductor device having a double diffusion structure.

2. Description of the Related Art

A power metal-oxide semiconductor field-effect transistor (MOSFET) has a higher power gain and a simpler gate driving circuit than a bipolar transistor. In addition, there is no time delay caused by accumulation or recombination of minority carriers during a turn-off operation of the power MOSFET. Therefore, the power MOSFET is widely used as a control, logic and power switch.

A primary example of a power MOSFET is a transistor using double diffusion technology such as a lateral double diffused MOSFET (LDMOS) or a drain extended MOSFET.

SUMMARY

According to an aspect of the present inventive concept, there is provided a semiconductor device comprising a fin pattern projecting upright on an active region of a substrate, a gate electrode disposed on the substrate and intersecting the fin pattern, a source region of a first conductivity type and disposed on one side of the gate electrode, a body region of a second conductivity type, situated within the fin pattern under the source region, and extending in a loop around the source region, a drain region of the first conductivity type and disposed on the other side of the gate electrode, a field dispersion region of the second conductivity type and situated within the fin pattern as interposed between the gate electrode and the drain region, and a drift region of the first conductivity type, situated within the fin pattern under the drain region and the field dispersion region, and extending in a loop around the drain region and the field dispersion region.

According to another aspect of the present inventive concept, there is provided a semiconductor device comprising a lower structure having a fin pattern, a first trench which defines the fin pattern, and a second trench contiguous with the first trench and in which the second trench extends more deeply within the lower structure than the first trench, a field insulating layer partially filling the first and second trenches, a gate electrode disposed on the field insulating layer and intersecting the fin pattern, a source region of a first conductivity type and disposed on one side of the gate electrode, a body region of a second conductivity type, situated within the fin pattern under the source region, and extending in a loop around the source region, a drain region of the first conductivity type and disposed on the other side of the gate electrode, a field dispersion region of the second conductivity type and situated within the fin pattern s interposed between the gate electrode and the drain region, and a drift region of the first conductivity type, situated within the fin pattern under the drain region and the field dispersion region, and extending in a loop around the drain region and the field dispersion region, and in which the field dispersion region and the gate electrode overlap as viewed in plan.

According to another aspect of the present inventive concept, there is provided a semiconductor device comprising an active region of semiconductor material, at least one fin extending lengthwise in a first direction on the active region, field insulation bordering the active region and a lower portion of each said at least one fin such that each at least one fin has an upper portion projecting upwardly beyond an upper surface of the field insulation, a gate electrode disposed on the substrate, extending in a second direction subtending an angle with the first direction, and intersecting the upper portion of each at least one fin, a source region of a first conductivity type and disposed on one side of the gate electrode, a drain region of the first conductivity type and disposed on the other side of the gate electrode, a body region of a second conductivity type and extending within the fin pattern under the source region and around the source region as viewed in plan, a field dispersion region of the second conductivity type and situated within the fin pattern between the gate electrode and the drain region, and a drift region of the first conductivity type, situated within the fin pattern under the drain region and the field dispersion region, and extending around the drain region and the field dispersion region as viewed in plan. The active region is wider in a second direction, perpendicular to the first direction, than each at least one fin.

BRIEF DESCRIPTION OF THE DRAWINGS

The above and other aspects and features of the present inventive concept will become more apparent from the following detailed description made with reference to the attached drawings, in which:

FIGS. 20 and 21 are a plan view and a perspective view of electronic products to which semiconductor devices according to the present inventive concept can be applied.

DETAILED DESCRIPTION

Figure 1:
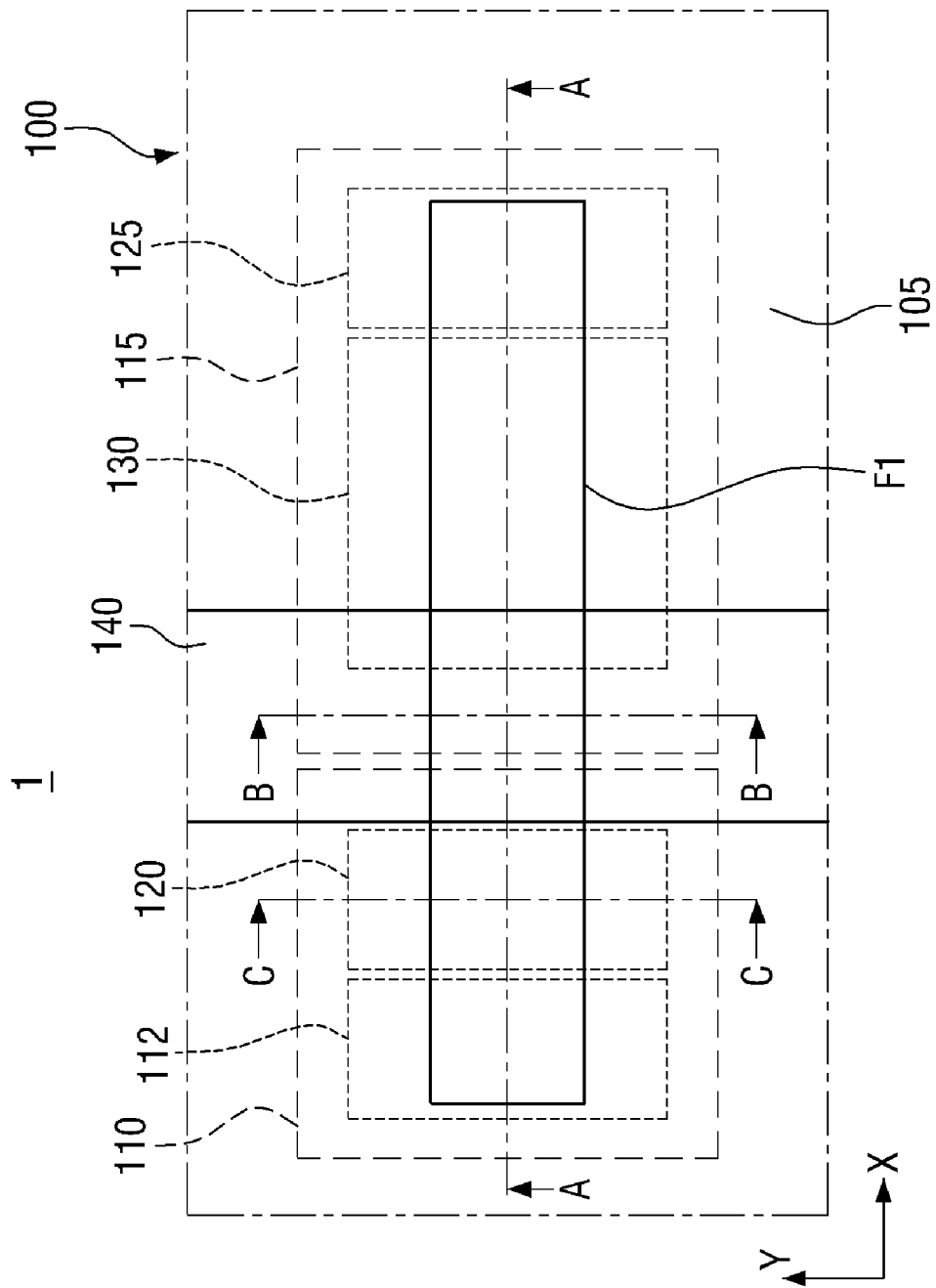
FIG. 1 is a conceptual plan view for use in describing various examples of semiconductor devices according to the present inventive concept.

The present inventive concept will now be described more fully hereinafter with reference to the accompanying drawings, in which examples of the inventive concept are shown. This inventive concept may, however, be exemplified in different forms and should not be construed as limited to the examples described herein. Rather, these examples are provided so that this disclosure will be thorough and complete, and will fully convey the scope of the inventive concept to those skilled in the art. The same reference numbers denote the same components throughout the drawings. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present. When a region or element is referred to as "overlapping" another region or element, it will be generally understood that the reference point is some point above the regions/elements, i.e., as viewed in plan. The term "surrounding" may also refer to the relative disposition of a region as viewed in plan, as the drawings make clear.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted. For example, the term semiconductor "substrate" as the context in the detailed description, the drawings and the claims will make clear may refer to an original portion only of a particular substrate whose other portions are processed to fabricate a semiconductor device, the entire portion of a semiconductor substrate including regions that are processed, e.g., doped, to form working regions of a semiconductor device, or simply a lower portion of a semiconductor device comprising a layer of semiconductor material regardless of whether that lower portion is a unitary body of material or comprises an insulating material on which the layer of semiconductor material is disposed such as a silicon-on-insulator (SOI) substrate.

Hereinafter, the present inventive concept will be described using a semiconductor device having N-type source/drain regions. However, it is obvious to those of ordinary skill in the art that the present inventive concept is also applicable to a semiconductor device having P-type source/drain regions. For example, the present inventive concept can be applied to a semiconductor device having P-type source/drain regions by replacing a P type specified herein with an N type and an N type specified herein with a P type.

An example of a semiconductor device 1 according to the present inventive concept will now be described with reference to FIGS. 1 through 4.

The semiconductor device 1 may include a first fin-type pattern F1, a gate electrode 140, a first source region 120, a body region 110, a first drain region 125, a drift region 115, and a first field dispersion region 130.

These elements of semiconductor device 1 may be formed at an active region ACT of a substrate 100.

The substrate 100 may include a base and an epitaxial layer grown on the base. However, the present inventive concept is not limited thereto, and the substrate 100 may include the base only, i.e., may be a bulk substrate. The substrate 100 may be a silicon substrate, a gallium arsenide substrate, a silicon germanium substrate, a ceramic substrate, a quartz substrate, a glass substrate for displays, or a semiconductor-on-insulator (SOI) substrate. The semiconductor 1 will be described hereinafter as having a silicon substrate as the substrate 100. In addition, the substrate 100 may have a first conductivity type (e.g., a P type).

The first fin pattern F1 may be formed on the substrate 100. The first fin pattern F1 may be formed in the active region ACT of the substrate 100. The first fin pattern F1 may extend along a first direction X.

The first fin pattern F1 may be part of the substrate 100 or may include an epitaxial layer grown from the substrate 100. The first fin pattern F1 may include an element semiconductor material such as silicon or germanium. In addition, the first fin pattern F1 may include a compound semiconductor such as a group IV-IV compound semiconductor or a group III-V compound semiconductor.

Specifically, a group IV-IV compound semiconductor forming the first fin pattern F1 may be a binary or ternary compound containing two or more of carbon (C), silicon (Si), germanium (Ge) and tin (Sn) or a compound obtained by doping the binary or ternary compound with a group IV element.

A group III-V compound semiconductor forming the first fin pattern F1 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In an example of the semiconductor device 1 according to the present inventive concept, the first fin pattern F1 is a silicon fin pattern.

In the example illustrated in FIG. 1, the first fin pattern F1 is rectangular (i.e., has a rectangular horizontal cross section). However, the present inventive concept is not limited thereto, and corners of the first fin pattern F1 can be oblique with respect to the sides of the first fin pattern F1, that is, chamfered. In addition, the rectangular first fin pattern F1 includes long sides and short sides.

As illustrated in FIG. 1, one first fin pattern F1 may be formed in the active region ACT. That is, the semiconductor device 1 may be a fin transistor having only one fin pattern F1. Alternatively, as in other examples described later one, two or more fin patterns can be formed in the active region ACT (i.e., a semiconductor device according to the inventive concept may have a dual fin structure or a multi-fin structure).

The first fin pattern F1 may be defined by a first trench ST having a first depth d1, and the active region ACT may be defined by a second trench DT having a second depth d2 greater than the first depth d1. The first trench ST may be a shallow trench, and the second trench DT may be a deep trench.

In this example, the first trench ST and the second trench DT are disposed immediately adjacent to each other. That is, no other trench (i.e., another shallow trench) is interposed between the first trench ST and the second trench DT.

A field insulating layer 105 may be formed on the substrate 100 and disposed around the first fin pattern F1. The first fin pattern F1 may be delimited by the field insulating layer 105.

The field insulating layer 105 may partially fill the first trench ST and the second trench DT. The field insulating layer 105 may surround part of the first fin pattern F1.

The field insulating layer 105 may be, for example, an oxide layer, a nitride layer, or a combination of these layers.

The first fin pattern F1 may include an upper portion 107a and a lower portion 107b. The upper portion 107a of the first fin pattern F1 may be disposed on the lower portion 107b of the first fin pattern F1. The lower portion 107b of the first fin pattern F1 may be surrounded by the field insulating layer 105 and contact the field insulating layer 105.

In the semiconductor device 1 according to the present inventive concept, the upper portion 107a of the first fin pattern F1 does not contact the field insulating layer 105. That is, long and short sides of the upper portion 107a of the first fin pattern F1 do not contact the field insulating layer 105 in this example.

The gate electrode 140 may be formed on the substrate 100 to extend along a second direction Y. More specifically, the gate electrode 140 may be disposed on the first fin pattern F1 and the field insulating layer 105. The gate electrode 140 may intersect the first fin pattern F1.

The gate electrode 140 may include at least one material selected from the group consisting of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W). When the gate electrode 140 includes silicon, the gate electrode 140 may include a silicide material.

The gate electrode 140 may be formed by, but not limited to, a replacement process (or a gate last process).

Gate spacers 145 may be formed on sidewalls of the gate electrode 140. The gate spacers 145 may comprise silicon nitride (SiN), silicon oxynitride (SiON), silicon oxide ($SiO_2$), silicon oxycarbonitride (SiOCN), or any of various combinations of the same.

A gate insulating layer 142 may be interposed between the first fin pattern F1 and the gate electrode 140. The gate insulating layer 142 may be formed along the profile of the upper portion 107a of the first fin pattern F1 which protrudes further upward than the field insulating layer 105. In addition, the gate insulating layer 142 may be interposed between the gate electrode 140 and the field insulating layer 105.

The gate insulating layer 142 may be interposed between the gate electrode 140 and each of the gate spacers 145. The gate insulating layer 142 may be formed along a sidewall surface of each of the gate spacers 145.

An interlayer insulating film 180 may be formed on the field insulating layer 105 to cover the first fin pattern F1. The interlayer insulating film 180 may include a gate trench 140t in which the gate electrode 140 is formed. The gate insulating layer 142 interposed between the first fin pattern F1 and the gate electrode 140 may be formed along the sides and bottom of the gate trench 140t.

The gate insulating layer 142 may be formed of silicon oxide, silicon oxynitride, silicon nitride or a high-k material having a higher dielectric constant than silicon oxide. For example, the high-k material may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first source region 120 may be disposed on a first side of the gate electrode 140. The first source region 120 may be formed in the first fin pattern F1.

Figure 4:
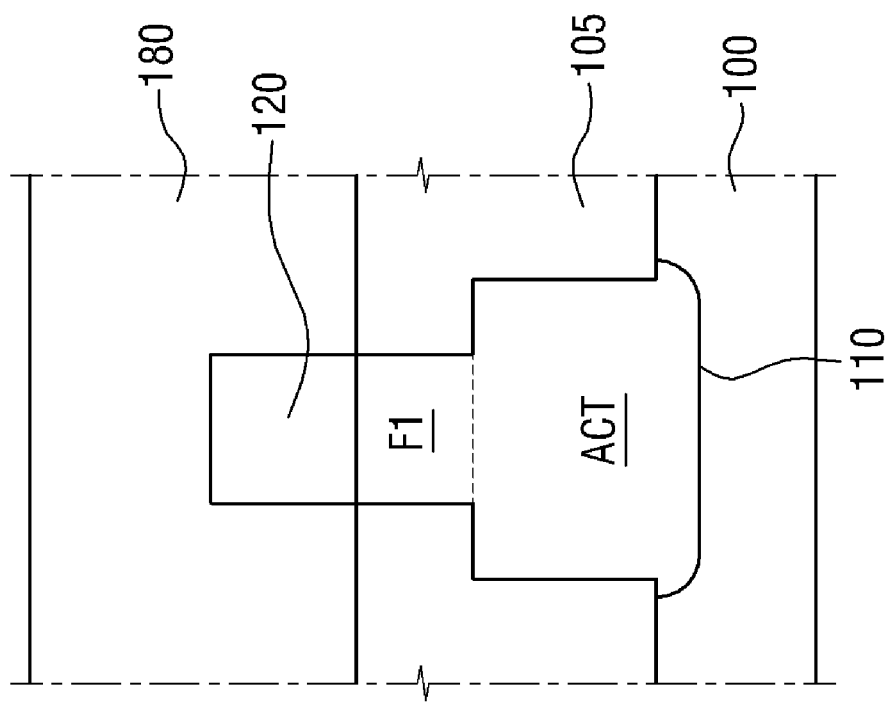

As shown in FIG. 4, the first source region 120 is formed in only a portion of the first fin pattern F1 which is located above the level of an upper surface of the field insulating layer 105. However, this feature of semiconductor device 1 is exemplary only and is for ease of illustration, and the present inventive concept is not limited to this feature.

To reduce the resistance between the first source region 120 and a contact which applies a source voltage to the first source region 120, a silicide layer may be formed on the first source region 120.

The body region 110 may be formed on the first side of the gate electrode 140. Specifically, the body region 110 may be formed under the first source region 120 to surround the first source region 120.

The body region 110 may be formed in the first fin pattern F1 and the active region ACT. The body region 110 may overlap the gate electrode 140, i.e., part of the body region 110 and the gate electrode 140 may be vertically juxtaposed.

The body region 110 may extend beyond the active region ACT to the substrate 100. That is, part of the body region 110 may be formed in the substrate 100.

In an example of semiconductor device 1 according to the present inventive concept, the depth of the body region 110 is greater than the depth d2 of the second trench DT which defines the active region ACT.

The body region 110 may have a lower doping concentration than the first source region 120 and the first drain region 125. Here, doping concentration refers to the concentration of impurities doped (or injected) into each region.

A first body contact region 112 may be formed in the body region 110 of the first fin pattern F1 to be adjacent to the first source region 120. The first body contact region 112 may have a higher doping concentration than the body region 110.

Figure 2:
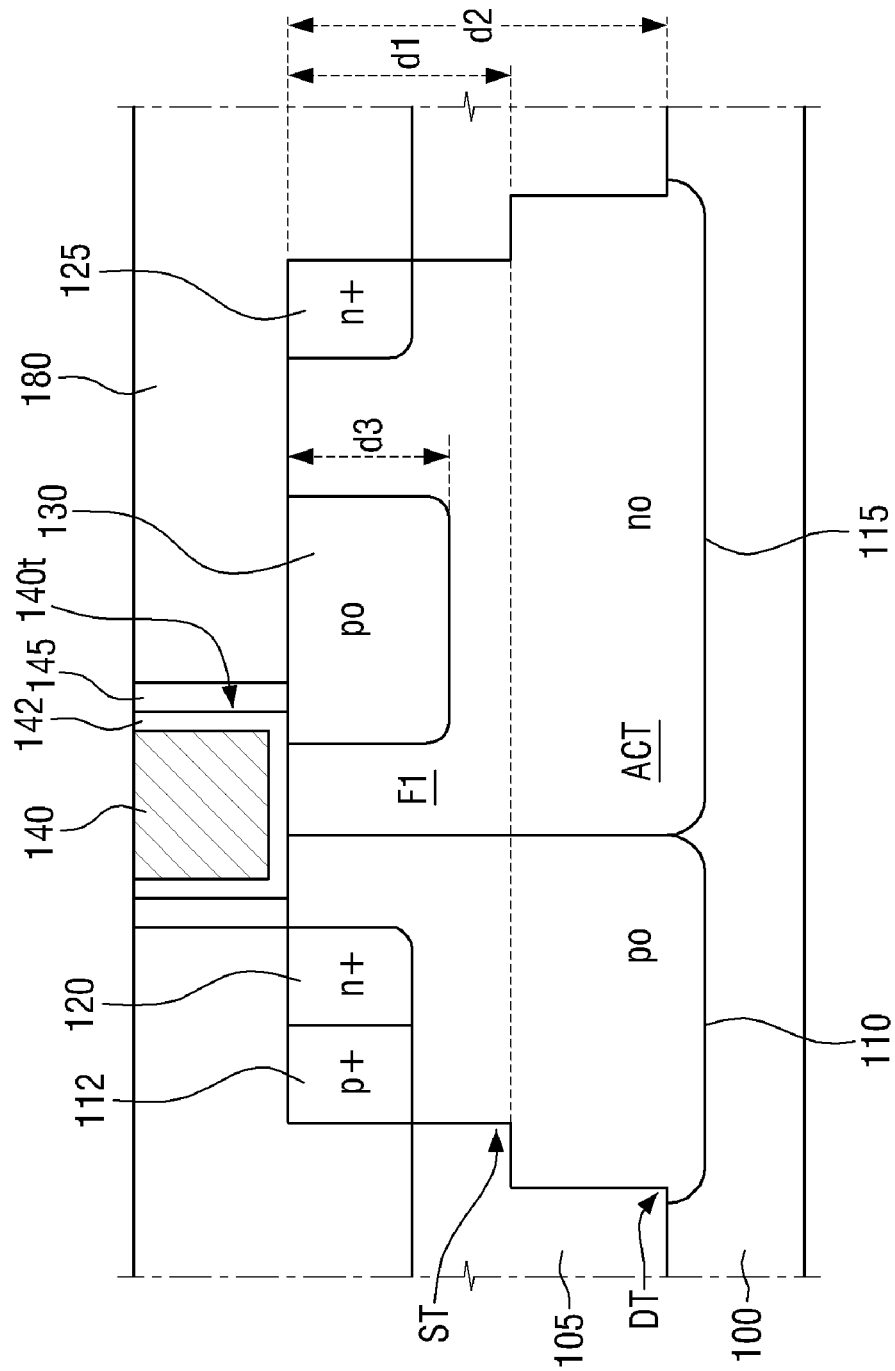
FIGS. 2, 3 and 4 are cross-sectional views of a semiconductor device, according to the present inventive concept, and respectively taken along directions corresponding to those of lines A-A, B-B, and C-C of the conceptual plan view of FIG. 1.
Figure 3:
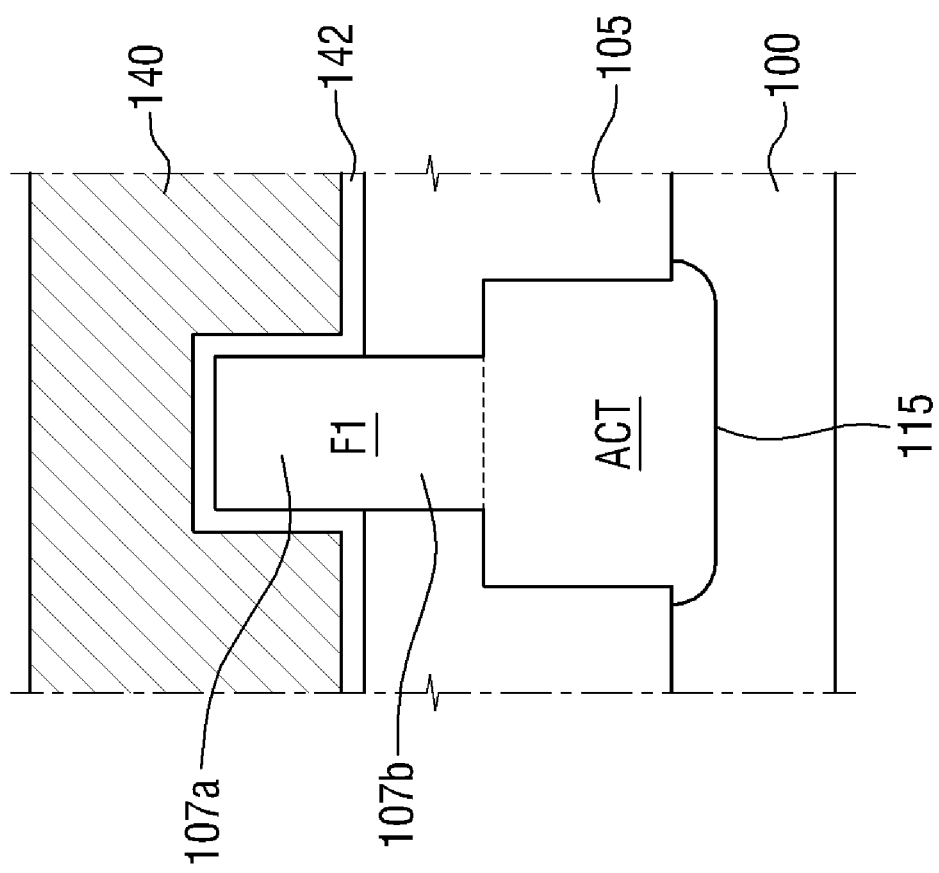

Although not illustrated in FIG. 2, a source extension region may be formed in the body region 110 to contact the first source region 120 and overlap the gate electrode 140.

The source extension region may have a lower doping concentration than the first source region 120 and the first drain region 125. In addition, the source extension region may have a lower doping concentration than the body region 110 and the drift region 115.

The first drain region 125 may be disposed on a second side of the gate electrode 140. The first drain region 125 may be formed in the first fin pattern F1.

To reduce the resistance between the first drain region 125 and a contact which applies a drain voltage to the first drain region 125, a silicide layer may be formed on the first drain region 125.

The first field dispersion region 130 may be formed on the second side of the gate electrode 140. More specifically, the first field dispersion region 130 may be interposed between the gate electrode 140 and the first drain region 125.

The first field dispersion region 130 may be formed in the first fin pattern F1. The first field dispersion region 130 may overlap the gate electrode 140.

In an example of the semiconductor device 1 according to the present inventive concept, a depth d3 to which the first field dispersion region 130 is formed may be smaller than the depth d1 of the first trench ST which defines the first fin pattern F1.

In addition, the first field dispersion region 130 may be formed in part of the lower portion 107b of the first fin pattern F and the upper portion 107a of the first fin pattern F1. The bottom of the first field dispersion region 130 may be situated a level lower than the level of the upper surface of the field insulating layer 105. That is, the field insulating layer 105 may cover part of the first field dispersion region 130.

As shown in FIG. 2, the first field dispersion region 130 is deeper than the first source region 120 and the first drain region 125. However, the present inventive concept is not limited thereto.

The first field dispersion region 130 may have a lower doping concentration than the first source region 120 and the first drain region 125.

The drift region 115 may be formed on the second side of the gate electrode 140. Specifically, the drift region 115 may be formed so as to be disposed under the first drain region 125 and the first field dispersion region 130. The drift region 115 may surround the first drain region 125 and the first field dispersion region 130. The first field dispersion region 130 may be disposed in the drift region 115.

The drift region 115 may be formed in the first fin pattern F1 and the active region ACT. The drift region 115 may overlap the gate electrode 140.

The drift region 115 may extend beyond the active region ACT to the substrate 100. That is, part of the drift region 115 may be formed in the substrate 100.

In an example of semiconductor device 1 according to the present inventive concept, a depth to which the drift region 115 is formed may be greater than the depth d2 of the second trench DT which defines the active region ACT.

The drift region 115 may have a lower doping concentration than the first source region 120 and the first drain region 125.

As shown in FIG. 2, the drift region 115 and the body region 110 contact each other. However, again, this feature is for ease of illustration, and the present inventive concept is not limited to this feature as illustrated.

In semiconductor device 1 according to the present inventive concept, a device isolation region such as a shallow trench isolation (STI) region or a local oxidation of silicon (LOCOS) region is not be formed in the drift region 115.

While the first field dispersion region 130 is formed in the drift region 115, it may contain impurities of a conductivity type different from the conductivity type of impurities contained in the drift region 115.

That is, the first field dispersion region 130 can disperse an electric field which would other concentrate in an edge portion of the gate electrode 140 because the first field dispersion region 130 and the drift region 115 have different conductivity types. Accordingly, the breakdown voltage characteristic of the semiconductor device 1 can be improved.

In addition, the interaction between the first field dispersion region 130 and the drift region 115 can minimize an electric field produced by the flow of current, thereby improving a breakdown voltage characteristic semiconductor device.

Furthermore, the first field dispersion region 130 improves the breakdown voltage characteristic of the semiconductor device 1. In particular, there is no need to form a device isolation region in the drift region 115 in consideration of the breakdown voltage. Therefore, a current path can be confined to the first fin pattern F1. In other words, ON resistance Ron of the semiconductor device 1 can be minimal because there is no need to extend the current path to the substrate 100.

Figure 5:
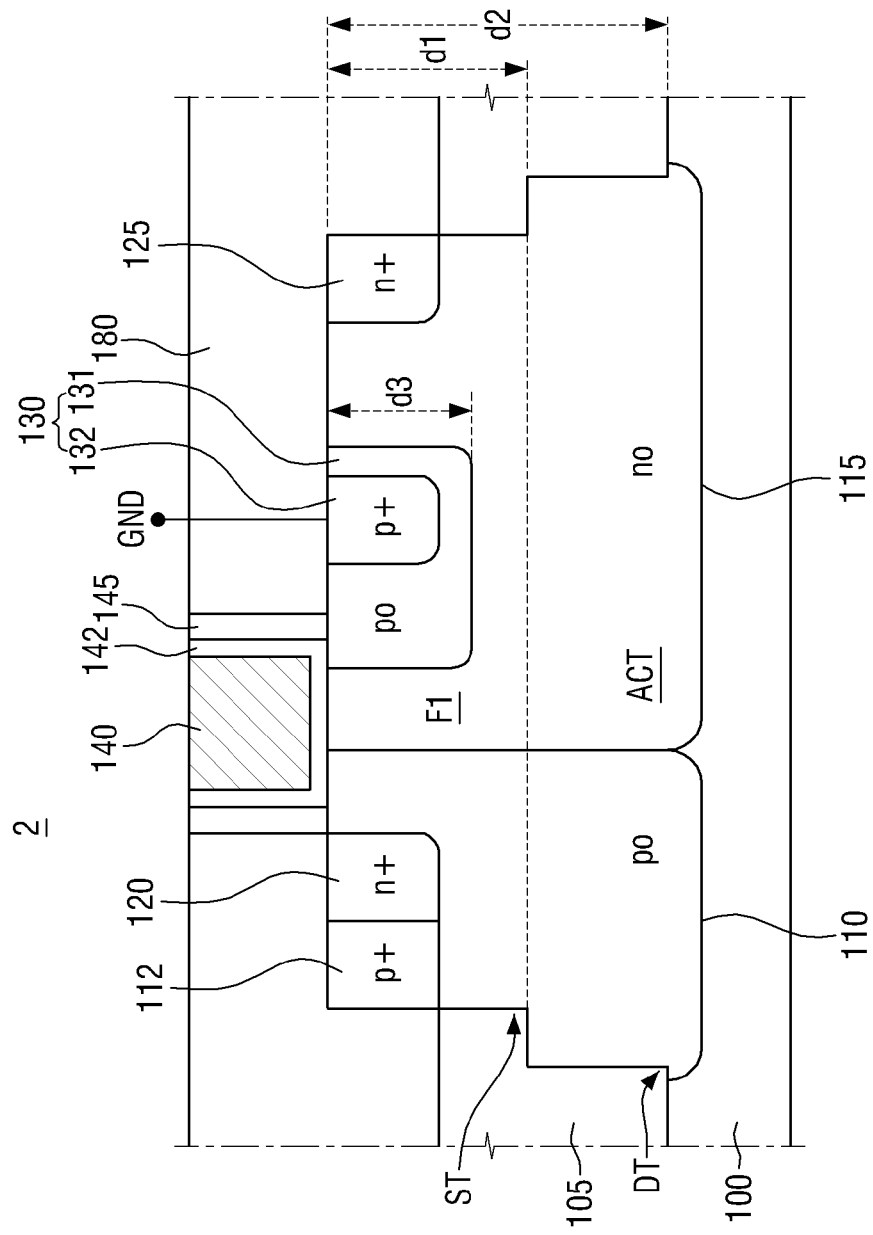
FIG. 5 is a cross-sectional view of another a semiconductor device according to the present inventive concept.

FIG. 5 illustrates a semiconductor device 2 according to the present inventive concept. For simplicity, semiconductor device 2 will be described focusing mainly on differences between semiconductor device 2 and semiconductor device 1.

Referring to FIG. 5, in the semiconductor device 2 according to the present inventive concept, a first field dispersion region 130 includes a first portion 131 and a second portion 132 having different concentrations of impurities.

The first portion 131 of the first field dispersion region 130 may be formed in a drift region 115. The first portion 131 of the first field dispersion region 130 may be shallower than a first trench ST which defines a first fin pattern F1.

In the semiconductor device 2 according to the present inventive concept, the second portion 132 of the first field dispersion region 130 is formed in the first portion 131 of the first field dispersion region 130. For example, the first portion 131 of the first field dispersion region 130 may surround the second portion 132 of the first field dispersion region 130. That is, the entire second portion 132 of the first field dispersion region 130 may be formed in the first portion 131 of the first field dispersion region 130.

The first portion 131 of the first field dispersion region 130 may overlap a gate electrode 140. However, the second portion 132 of the first field dispersion region 130 may not overlap the gate electrode 140. That is, the first portion 131 of the first field dispersion region 130 may be located between the second portion 132 of the first field dispersion region 130 and the gate electrode 140.

The concentration of impurities in the first portion 131 of the first field dispersion region 130 may be lower than that of impurities in the second portion 132 of the first field dispersion region 130.

The first portion 131 of the first field dispersion region 130 may have a lower doping concentration than a first source region 120 and a first drain region 125. On the other hand, the second portion 132 of the first field dispersion region 130 may have a higher doping concentration than a body region 110 and the drift region 115.

Furthermore, the second portion 132 of the first field dispersion region 130 may be electrically connected to a ground voltage.

Figure 6:
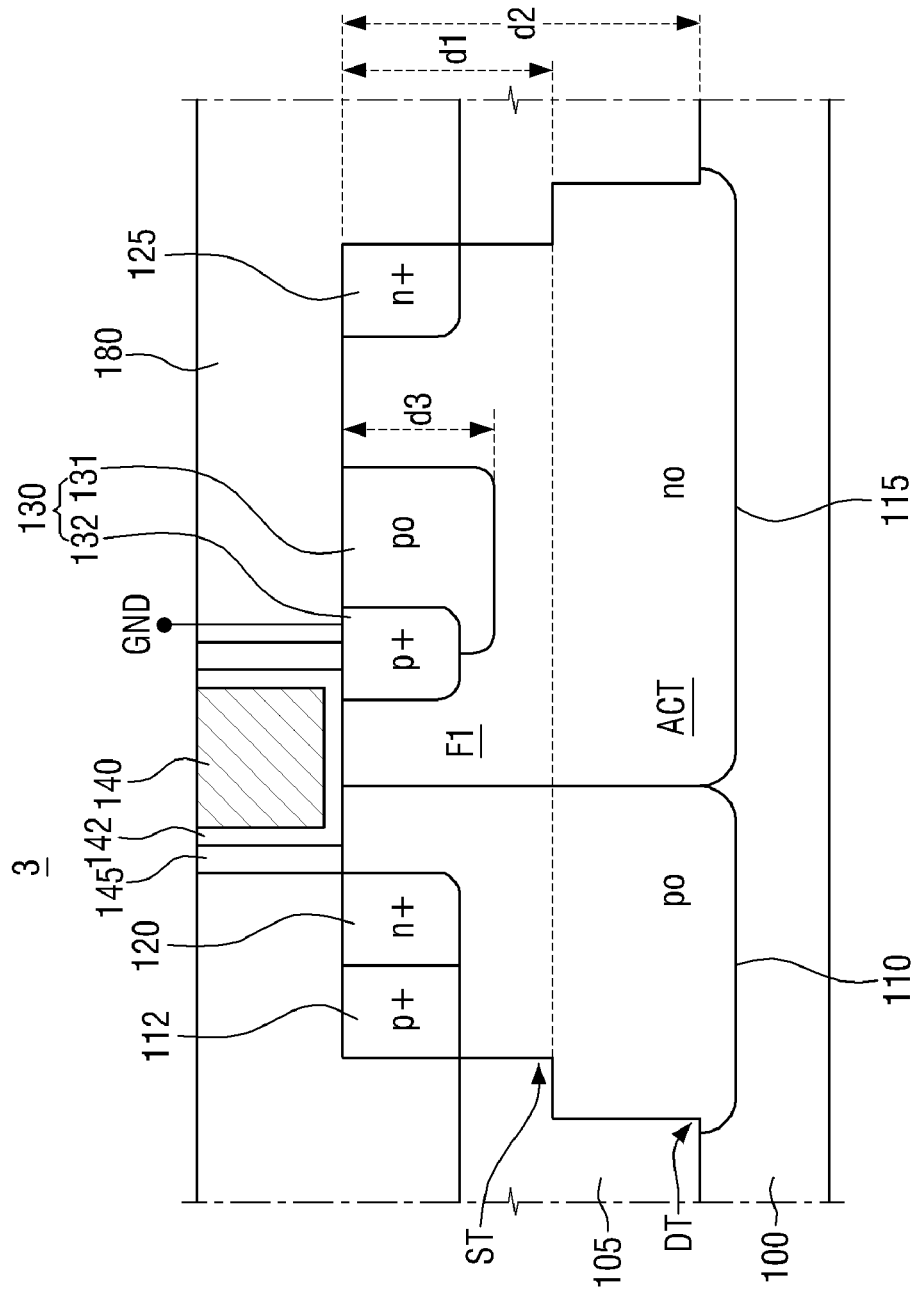
FIG. 6 is a cross-sectional view of still another semiconductor device according to the present inventive concept.

FIG. 6 illustrates a semiconductor device 3 according to the present inventive concept. For simplicity, the semiconductor device 3 will be described focusing mainly on differences between semiconductor device 3 and semiconductor device 2.

Referring to FIG. 6, in the semiconductor device 3 according to the present inventive concept, a second portion 132 of a first field dispersion region 130 overlaps a gate electrode 140.

In the semiconductor device 3 according to the present inventive concept, the second portion 132 of the first field dispersion region 130 may include a region which overlaps a first portion 131 of the first field dispersion region 130 and a region which does not overlap the first portion 131 of the first field dispersion region 130.

In other words, the entire second portion 132 of the first field dispersion region 130 is not be disposed within the first portion 131 of the first field dispersion region 130 in this example.

The region of the second portion 132 which does not overlap the first portion 131 of the first field dispersion region 130 may be formed in a drift region 115 and surrounded by the drift region 115.

Figure 7:
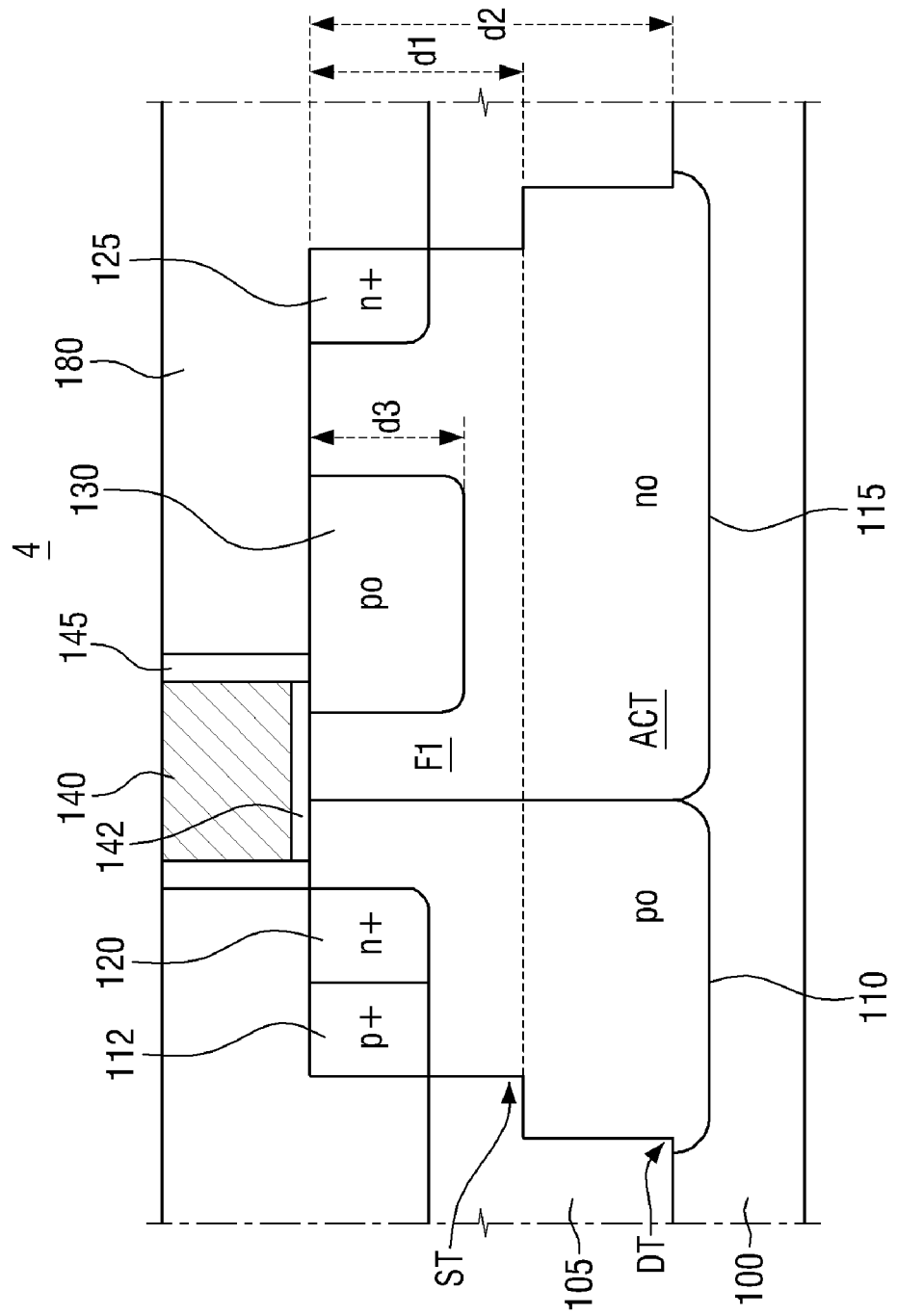
FIG. 7 is a cross-sectional view of still another semiconductor device according to the present inventive concept.

FIG. 7 illustrates a semiconductor device 4 according to the present inventive concept. For simplicity, semiconductor device 4 will be described focusing mainly on differences between semiconductor device 4 and semiconductor device 1.

Referring to FIG. 7, the semiconductor device 4 according to the present inventive gate insulating layer 142 is not interposed between a gate electrode 140 and gate spacers 145. That is, the gate insulating layer 142 does not extend along sidewall surfaces of each of the gate spacers 145 in a second direction Y.

Rather, the gate insulating layer 142 is formed along the profile of that part of a first fin pattern F1 which is situated above the level of that of an upper surface of a field insulating layer 105.

Figure 8:
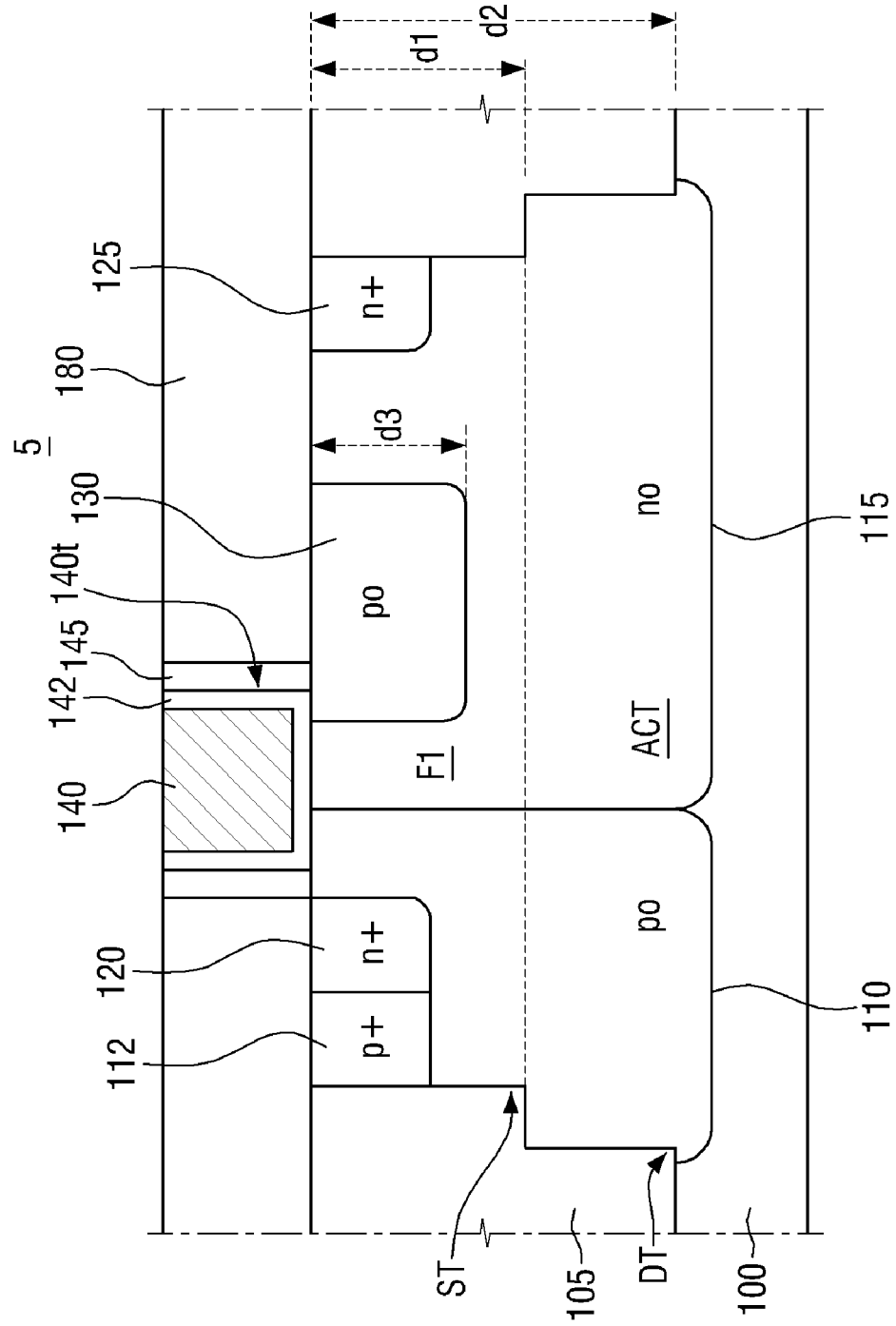
FIG. 8 is a cross-sectional view of still another semiconductor device according to the present inventive concept.

FIG. 8 illustrates a semiconductor device 5 according to the present inventive concept. For simplicity, semiconductor device 5 will be described focusing mainly on differences between semiconductor device 5 and semiconductor device 1.

Referring to FIG. 8, in the semiconductor device 5 according to the present inventive concept, the relatively short sides of a first fin pattern F1, more specifically, the short sides of an upper portion 107a (see FIG. 3) of the first fin pattern F1, contact a field insulating layer 105 over their entirety.

On the other hand, in the semiconductor device 5 according to the present inventive concept, the relatively long sides of the upper portion 107a of the first fin pattern F1 do not contact the field insulating layer 105.

Figure 9:
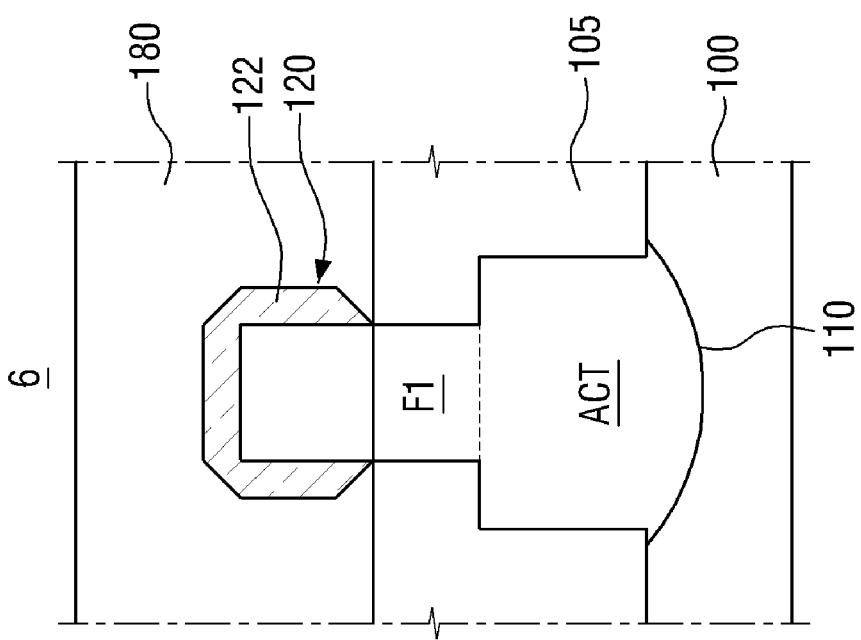
FIG. 9 is a cross-sectional view of still another semiconductor device according to the present inventive concept taken in a direction corresponding to the direction of line C-C of FIG. 1.
Figure 10:
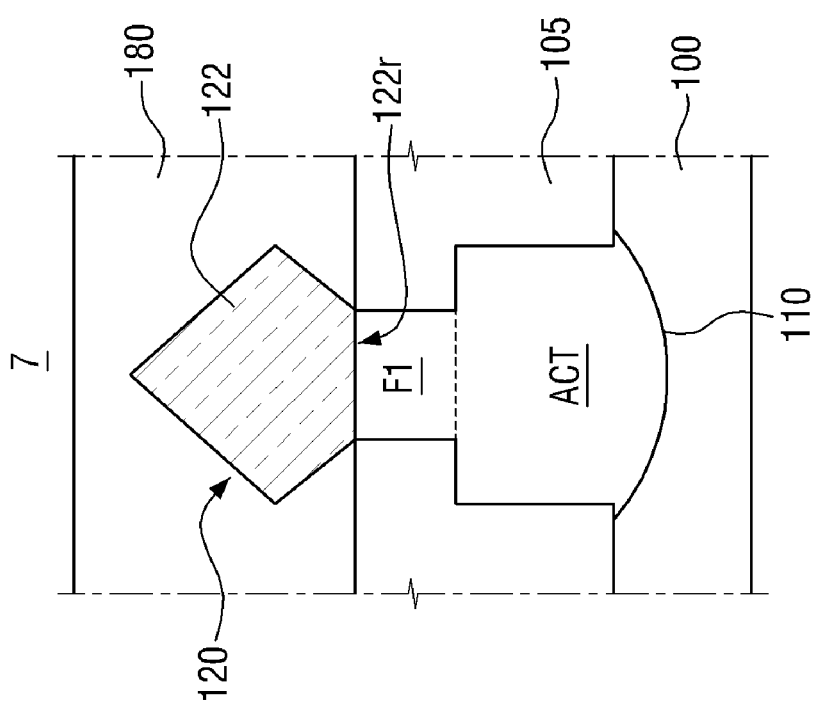
FIG. 10 is a cross-sectional view of still another semiconductor device according to the present inventive concept, also taken in a direction corresponding to the direction of line C-C of FIG. 1.

FIG. 9 illustrates a semiconductor device 6 according to the present inventive concept. FIG. 10 illustrates a semiconductor device 7 according to the present inventive concept. For simplicity, the semiconductor devices 6 and 7 will be described focusing mainly on differences between the semiconductor devices 6 and 7 and the semiconductor device 1.

Referring to FIG. 9, in the semiconductor device 6 according to the present inventive concept, a first source region 120 further includes a first epitaxial layer 122 formed on sidewall and upper surfaces of a first fin pattern F1.

In other words, the first epitaxial layer 122 may be formed along the profile of that part of the first fin pattern F1 which is situated above the level of an upper surface of a field insulating layer 105. The first source region 120 may be an elevated source region.

In addition, each of a first drain region 125, a first body contact region 112 and/or a first field dispersion region 130 may include an epitaxial layer formed on the sidewall and upper surfaces of the first fin pattern F1.

When the first fin pattern F1 is a silicon fin active pattern, the first epitaxial layer 122 may be one of, but not limited to, a silicon epitaxial layer, a silicon germanium epitaxial layer, and a carbon-containing silicon epitaxial layer.

Referring to FIG. 10, in the semiconductor device 7 according to the present inventive concept, a first recess 122r is formed in a first fin pattern F1 on a side of a gate electrode 140.

A first epitaxial layer 122 may fill the first recess 122r and may be formed on the first fin pattern F1. A first source region 120 may include the first epitaxial layer 122 which fills the first recess 122r and may be an elevated source region.

The outer circumferential surface of the first epitaxial layer 122 may have various vertical cross-sectional shapes or profiles. For example, the profile of the outer circumferential surface of the first epitaxial layer 122 may have the shape of (part of) a diamond, a circle, or a rectangle. FIG. 10 illustrates an example in which the profile of the outer circumferential surface of the first epitaxial layer 122 has the shape of (part of) a diamond (wherein the vertical cross section of the first epitaxial layer 122 is pentagonal). In another example, the vertical cross section of the first epitaxial layer 122 is hexagonal.

In the case in which the semiconductor devices are N-type semiconductor devices, the first epitaxial layer 122 may include a tensile stress material. For example, when the first fin pattern F1 is of Si, the first epitaxial layer 122 may be a material (e.g., SiC) having a smaller lattice constant than Si. The tensile stress material can improve the mobility of carriers in a channel region by applying tensile stress to the first fin pattern F1. Alternatively, the first epitaxial layer 122 may include the same material (i.e., Si) as the first fin pattern F1.

In the case in which the semiconductor devices are P-type semiconductor devices, the first epitaxial layer 122 may include a compressive stress material. For example, the compressive stress material may have a greater lattice constant than Si and may be SiGe. The compressive stress material may improve the mobility of carriers in the channel region by applying compressive stress to the first fin pattern F1.

Like the first source region 120, each of a first drain region 125, a first body contact region 112 and/or a first field dispersion region 130 may include an epitaxial layer which fills a recess formed in the first fin pattern F1.

Figure 11:
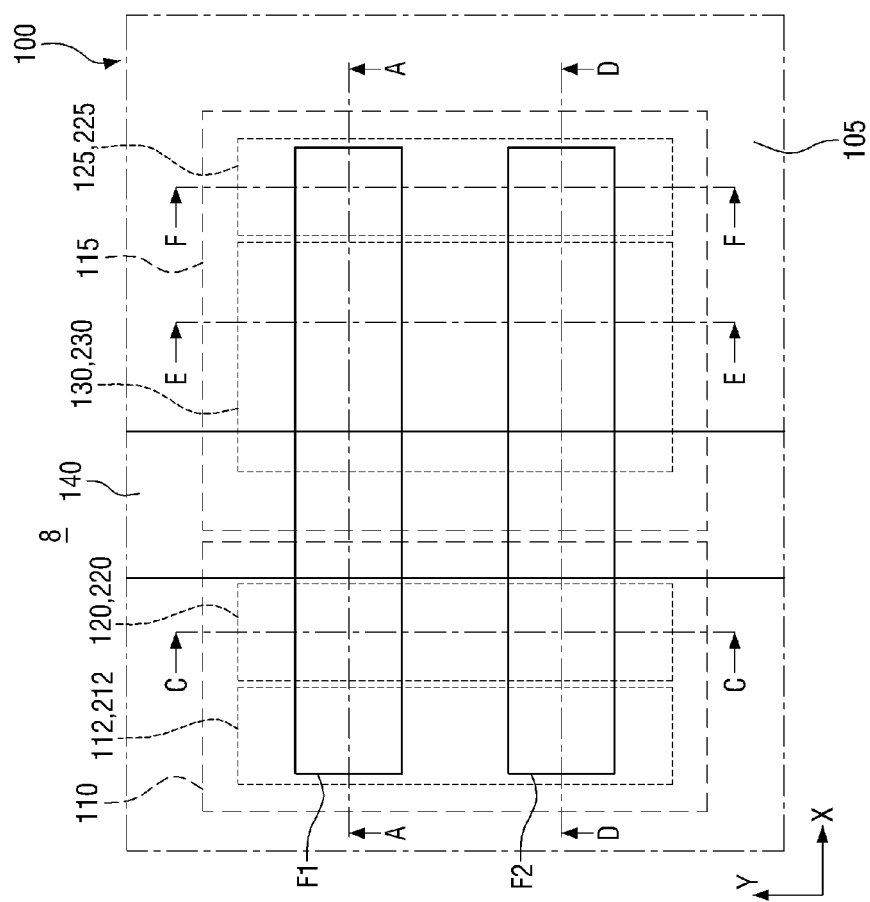
FIG. 11 is a conceptual plan view of still another semiconductor device according to the present inventive concept.
Figure 14:
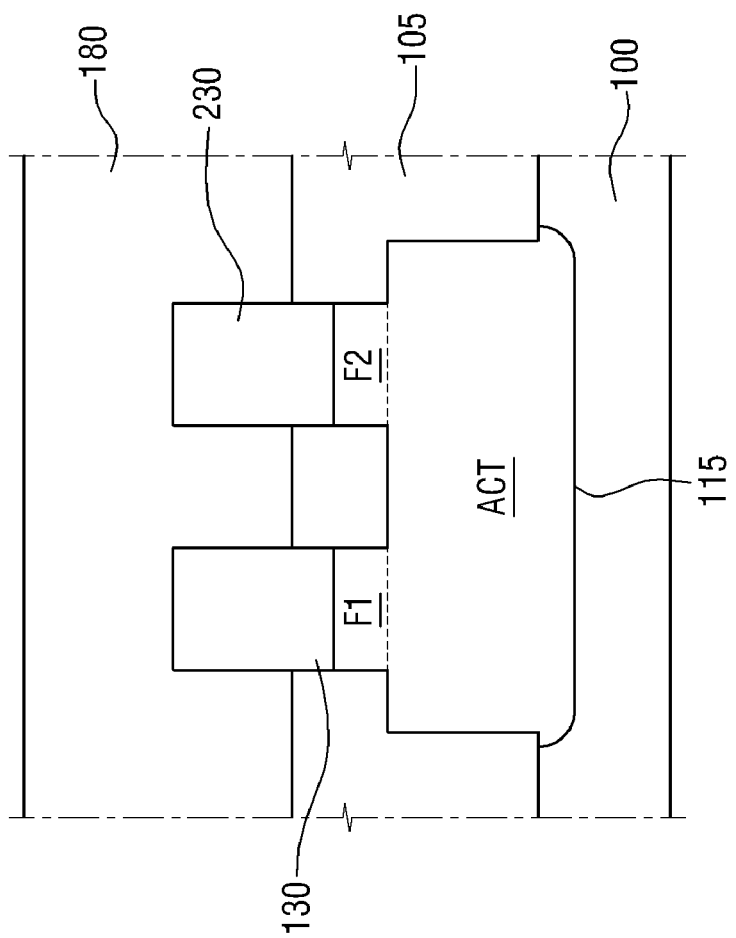
FIG. 14 is a cross-sectional view taken along line E-E of FIG. 11.

Another semiconductor device 8 according to the present inventive concept will now be described with reference to FIGS. 11 through 14. For simplicity, elements identical to those described above with reference to FIGS. 1 through 4 will be described briefly or not at all. For reference, the cross section of semiconductor device 8 taken along line A-A of FIG. 11 is substantially identical to that shown in FIG. 2. The cross section of semiconductor device 8 taken along line F-F of FIG. 11 as shown in FIG. 14 is a cut-out of a drain portion and is substantially identical to that shown in FIG. 12 but for purposes of description some different reference characters are used.

Referring to FIGS. 11 through 14, the semiconductor device 8 according to the present inventive concept may include a first fin pattern F1, a second fin pattern F2, a gate electrode 140, a first source region 120, a second source region 220, a body region 110, a first drain region 125, a second drain region 225, a drift region 115, a first field dispersion region 130, and a second field dispersion region 230.

The first fin pattern F1 and the second fin pattern F2 may be formed on a substrate 100. The first fin pattern F1 and the second fin pattern F2 may be formed at an active region ACT of the substrate 100.

The first fin pattern F1 and the second fin pattern F2 may extend lengthwise along a first direction X. The first fin pattern F1 and the second fin pattern F2 may be disposed side by side with each other. In other words, the first fin pattern F1 and the second fin pattern F2 extending along the first direction X may be spaced apart in a second direction Y.

The first fin pattern F1 and the second fin pattern F2 may be separated by a first trench ST having a first depth. The first fin pattern F1 and the second fin pattern F2 may be separated by a field insulating layer 105 which partially fills the first trench ST and a second trench DT.

The first fin pattern F1, the first source region 120, the first drain region 125, and the first field dispersion region 130 are substantially the same as those described above with reference to FIGS. 1 through 4, and thus a description thereof is omitted.

The gate electrode 140 may be disposed on the first fin pattern F1, the second fin pattern F2, and the field insulating layer 105. The gate electrode 140 may intersect the first fin pattern F1 and the second fin pattern F2.

The second source region 220 may be disposed on a first side of the gate electrode 140. The second source region 220 may be formed in the second fin pattern F2.

Figure 12:
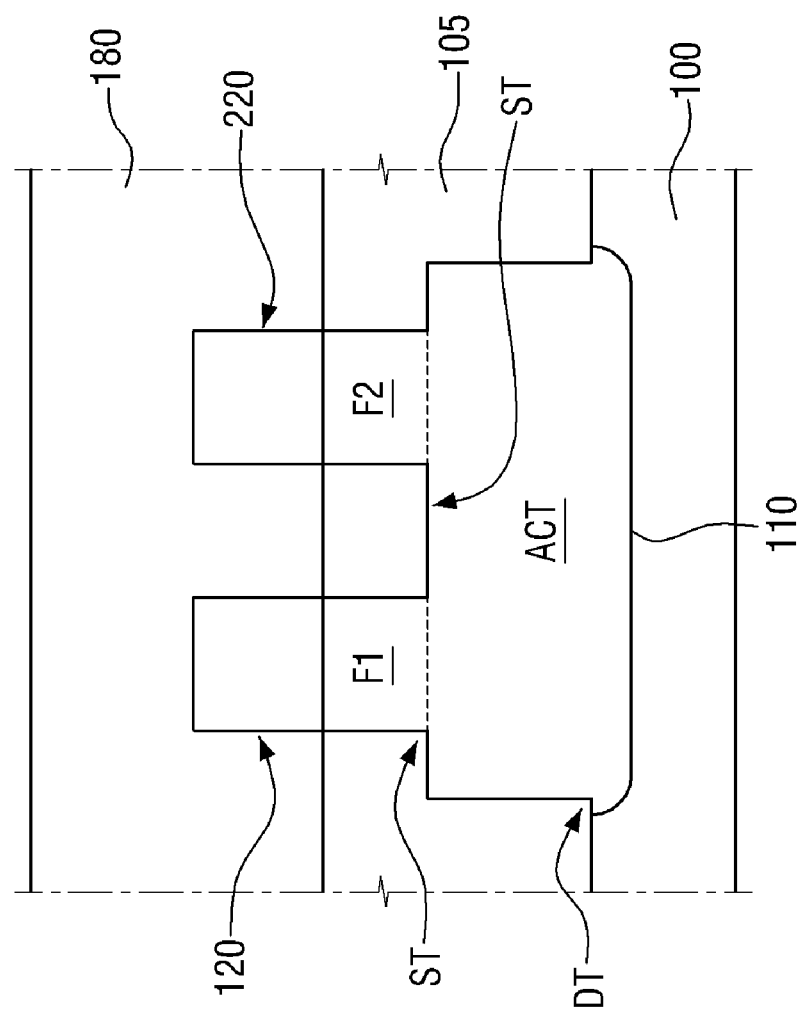
FIG. 12 is a cross-sectional view taken along line C-C of FIG. 11.
Figure 13:
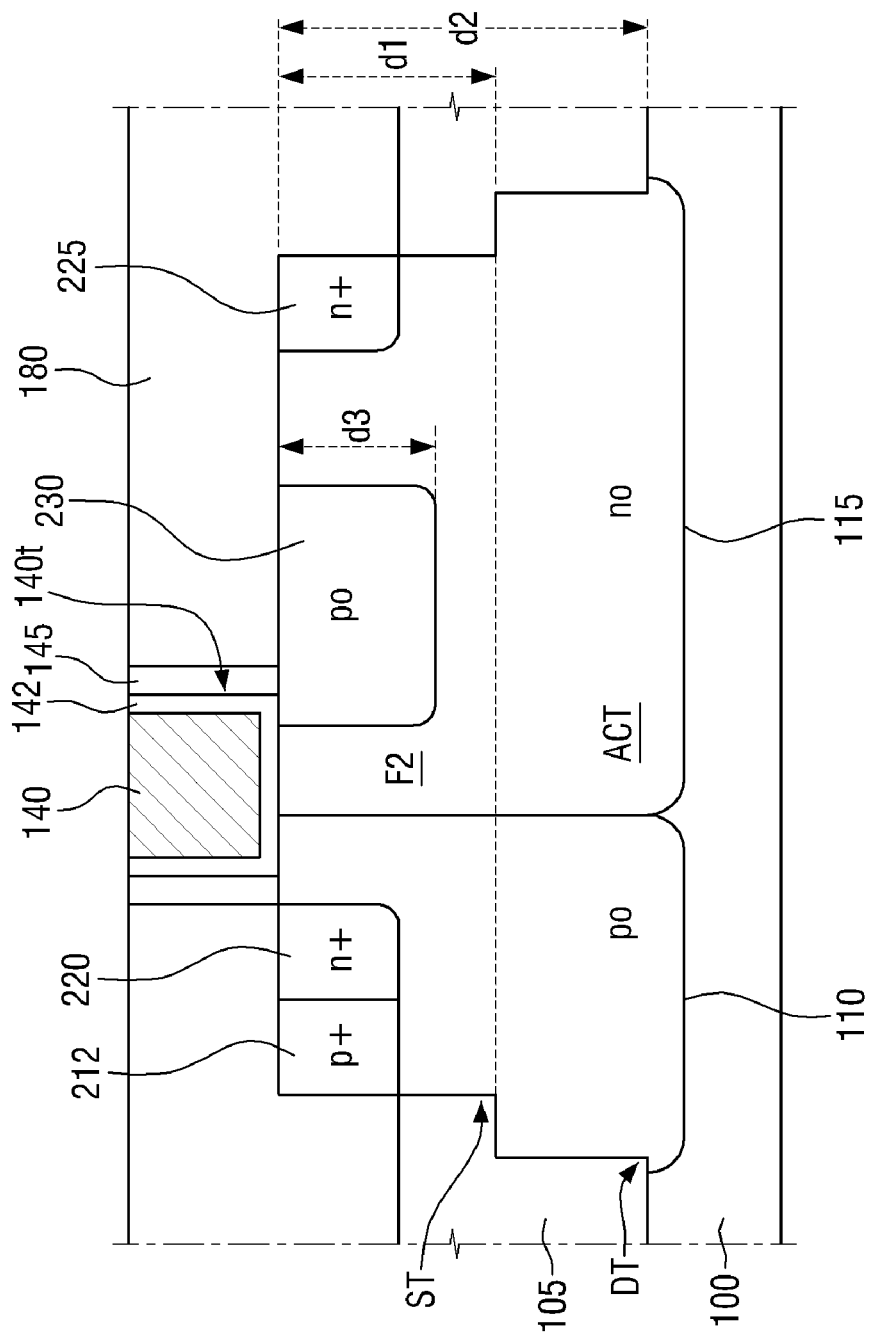
FIG. 13 is a cross-sectional view taken along line D-D of FIG. 11.

The second source region 220 may correspond to the first source region 120. Referring to FIG. 12, the first source region 120 and the second source region 220 may be formed in the first fin pattern F1 and the second fin pattern F2, respectively. Therefore, the first source region 120 and the second source region 220 do not contact each other in the active region ACT.

That is, the first source region 120 and the second source region 220 do not contact each other in the body region 110.

To reduce the resistance between the second source region 220 and a contact which applies a source voltage to the second source region 220, a silicide layer may be formed on the second source region 220.

The second source region 220 may have a higher doping concentration than the body region 110.

The body region 110 may be formed on the first side of the gate electrode 140. Specifically, the body region 110 may be disposed under the first source region 120 and the second source region 220 as surrounding the first source region 120 and the second source region 220.

The body region 110 may be formed in the first fin pattern F1, the second fin pattern F2 and the active region ACT.

The body region 110 may extend beyond the active region ACT to the substrate 100. That is, part of the body region 110 may be formed in the substrate 100.

A second body contact region 212 may be formed in the body region 110 of the second fin pattern F2 as adjacent to the second source region 220. The second body contact region 212 may have a higher doping concentration than the body region 110.

The second drain region 225 may be disposed on a second side of the gate electrode 140. The second drain region 225 may be formed in the second fin pattern F2.

The second drain region 225 may correspond to the first drain region 125. Similarly to FIG. 12, the first drain region 125 and the second drain region 225 may be formed in the first fin pattern F1 and the second fin pattern F2, respectively. Therefore, the first drain region 125 and the second drain region 225 do not contact each other in the active region ACT.

That is, the first drain region 125 and the second drain region 225 do not contact each other in the drift region 115.

To reduce the resistance between the second drain region 225 and a contact which applies a drain voltage to the second drain region 225, a silicide layer may be formed on the second drain region 225.

The second drain region 225 may have a higher doping concentration than the drift region 115.

The second field dispersion region 230 may be formed on the second side of the gate electrode 140. More specifically, the second field dispersion region 230 may be interposed between the gate electrode 140 and the second drain region 225.

The second field dispersion region 230 may be formed in the second fin pattern F2. The second field dispersion region 230 may overlap the gate electrode 140.

In addition, the second field dispersion region 230 may be shallower than the first trench ST which defines the first fin pattern F1 and the second fin pattern F2.

Referring to FIG. 14, the first field dispersion region 130 may be formed in the first fin pattern F1, and the second field dispersion region 230 may be formed in the second fin pattern F2. Therefore, the first field dispersion region 130 and the second field dispersion region 230 do not contact each other in the active region ACT.

The first field dispersion region 130 and the second field dispersion region 230 do not contact each other in the drift region 115.

The drift region 115 may be formed on the second side of the gate electrode 140. The drift region 115 may be formed under the first drain region 125, the first field dispersion region 130, the second drain region 225, and the second field dispersion region 230. The drift region 115 may surround the first drain region 125, the first field dispersion region 130, the second drain region 225, and the second field dispersion region 230.

The first field dispersion region 130 and the second field dispersion region 230 may be disposed in the drift region 115.

The drift region 115 may be formed in the first fin pattern F1, the second fin pattern F2, and the active region ACT.

The drift region 115 may extend beyond the active region ACT to the substrate 100. That is, part of the body region 110 may be formed in the substrate 100.

Figure 15:
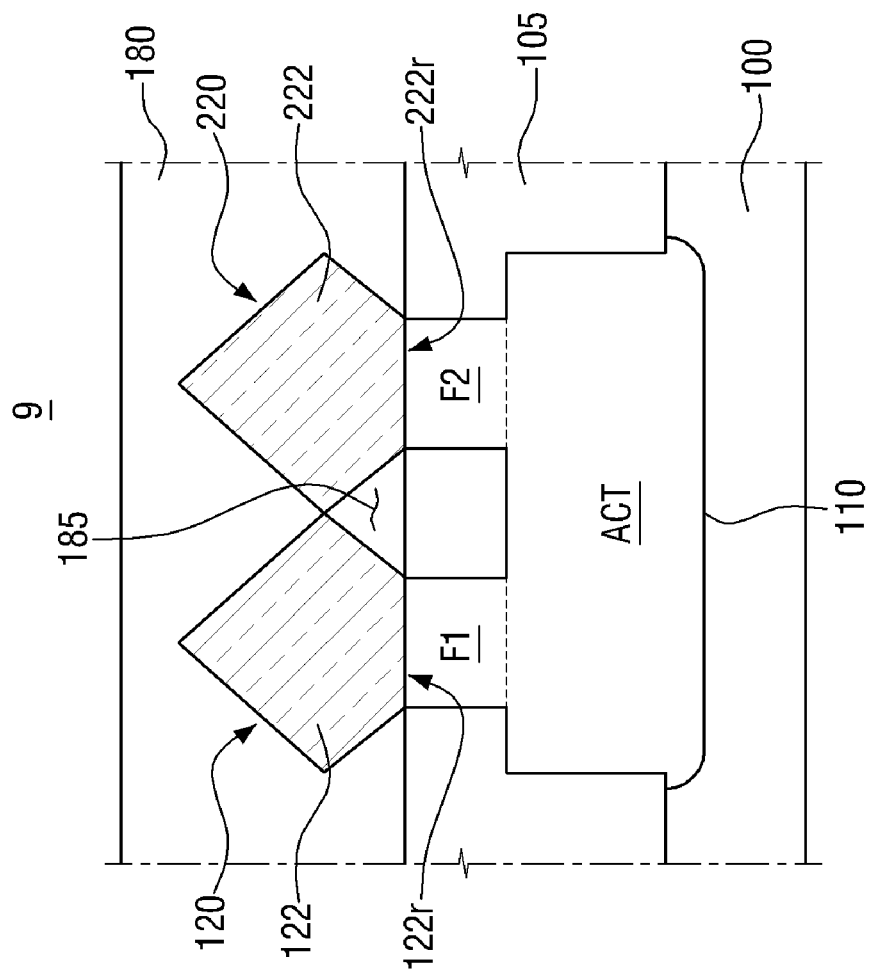
FIG. 15 is a cross-sectional view of still another semiconductor device according to the present inventive concept taken in a direction corresponding to the direction of line C-C of FIG. 11.

FIG. 15 illustrates a semiconductor device 9 according to the present inventive concept. For simplicity, the semiconductor device 9 will be described focusing mainly on differences between the semiconductor device 9 and the semiconductor device 1.

In the semiconductor device 9 according to the present inventive concept, a first source region 120 and a second source region 220 contact each other.

Similarly, a first drain region 125 and a second drain region 225 contact each other.

Accordingly, an air gap 185 may be formed between the first source region 120 and the second source region 220.

Similarly, an air gap 185 may be present between the first drain region 125 and the second drain region 225.

The first source region 120 may include a first epitaxial layer 122 which fills a first recess 122r formed in the first fin pattern F1, and the second source region 220 may include a second epitaxial layer 222 which fills a second recess 222r formed in the second fin pattern F2.

Figure 16:
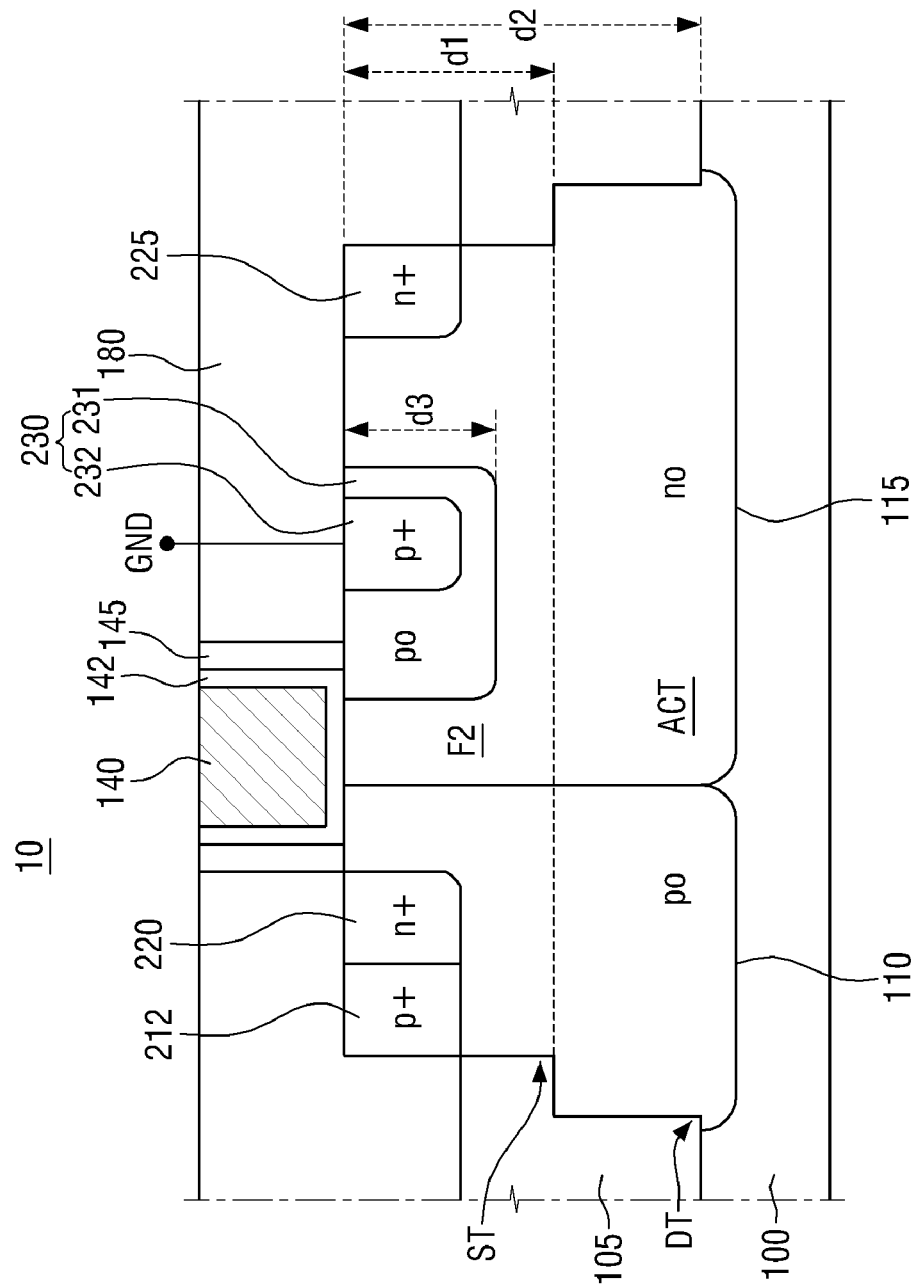
FIG. 16 is a cross-sectional view of still another semiconductor device according to a tenth embodiment of the present inventive concept.

FIG. 16 illustrates a semiconductor device 10 according to the present inventive concept. For simplicity, the semiconductor device 10 will be described focusing mainly on differences between the semiconductor device 10 and the semiconductor device 1.

For reference, FIG. 16 is a cross-sectional view taken in a direction corresponding to line D-D of FIG. 11, and a cross section of the semiconductor device 10 taken in a direction corresponding to line A-A of FIG. 11 is substantially identical to that shown in FIG. 5. In addition, semiconductor device 10 has a first field dispersion region situated within a first fin pattern similar to the semiconductor device 2 as shown in FIG. 5, and thus a detailed description thereof will be omitted.

Referring to FIG. 16, in the semiconductor device 10 according to the present inventive concept, a second field dispersion region 230 includes a first portion 231 and a second portion 232 having different concentrations of impurities.

The first portion 231 of the second field dispersion region 230 may be formed in a drift region 115. The first portion 231 of the second field dispersion region 230 may be shallower than a first trench ST which defines a second fin pattern F2.

The second portion 232 of the second field dispersion region 230 may be formed in the first portion 231 of the second field dispersion region 230. For example, the first portion 231 of the second field dispersion region 230 may surround the second portion 232 of the second field dispersion region 230. That is, the entire second portion 232 of the second field dispersion region 230 may be formed in the first portion 231 of the second field dispersion region 230.

The first portion 231 of the second field dispersion region 230 overlaps a gate electrode 140 in this example. However, the second portion 232 of the second field dispersion region 230 does not overlap the gate electrode 140.

The concentration of impurities in the first portion 231 of the second field dispersion region 230 may be lower than that of impurities in the second portion 232 of the second field dispersion region 230.

The second portion 232 of the second field dispersion region 230 may be electrically connected to a ground voltage.

Figure 17:
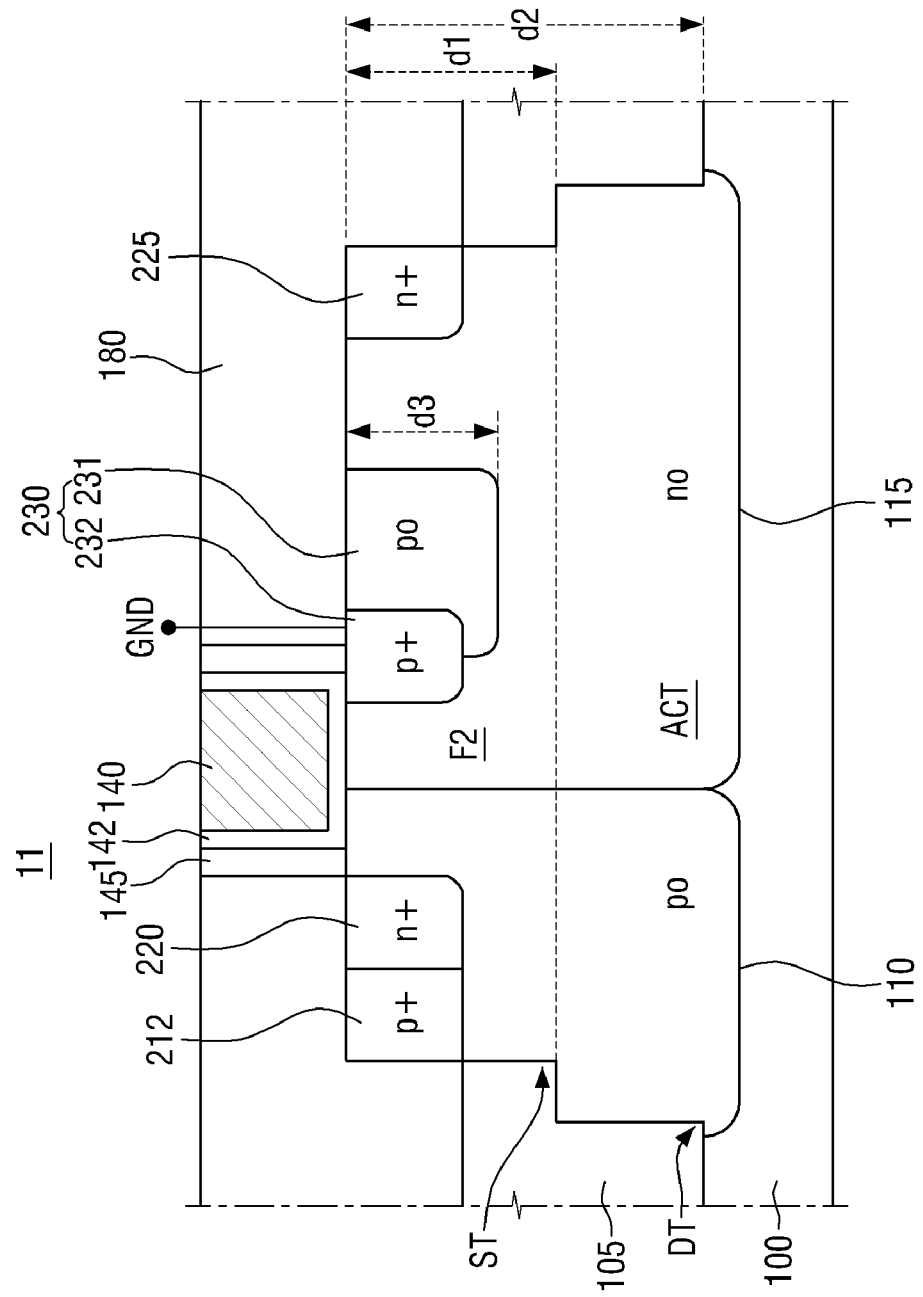
FIG. 17 is a cross-sectional view of still another semiconductor device according to the present inventive concept.

FIG. 17 illustrates a semiconductor device 11 according to the present inventive concept. For simplicity, the semiconductor device 11 will be described focusing mainly on differences between the semiconductor device 11 and the semiconductor device 10.

For reference, FIG. 16 is a cross-sectional view taken in a direction corresponding to line D-D of FIG. 11, and a cross section of the semiconductor device 10 taken in a direction corresponding to line A-A of FIG. 11 is substantially identical to that shown in FIG. 5. In addition, semiconductor device 11 has a first field dispersion region situated within a first fin pattern similar to the semiconductor device 3 as shown in FIG. 6, and thus a detailed description thereof will be omitted.

Referring to FIG. 17, in the semiconductor device 11 according to the present inventive concept, a second portion 232 of a second field dispersion region 230 overlaps a gate electrode 140.

The second portion 232 of the second field dispersion region 230 may also overlap a first portion 231 of the second field dispersion region 230 and in this case, has a region which does not overlap the first portion 231 of the second field dispersion region 230.

In other words, only part of the second portion 232 of the second field dispersion region 230 is situated within the first portion 231 of the second field dispersion region 230.

The region of the second portion 232 which does not overlap the first portion 231 of the second field dispersion region 230 may be situated within a drift region 115 and surrounded by the drift region 115.

Semiconductor systems and electronic products having semiconductor devices according to the present inventive concept will now be described with reference to FIGS. 18 through 21.

Figure 18:
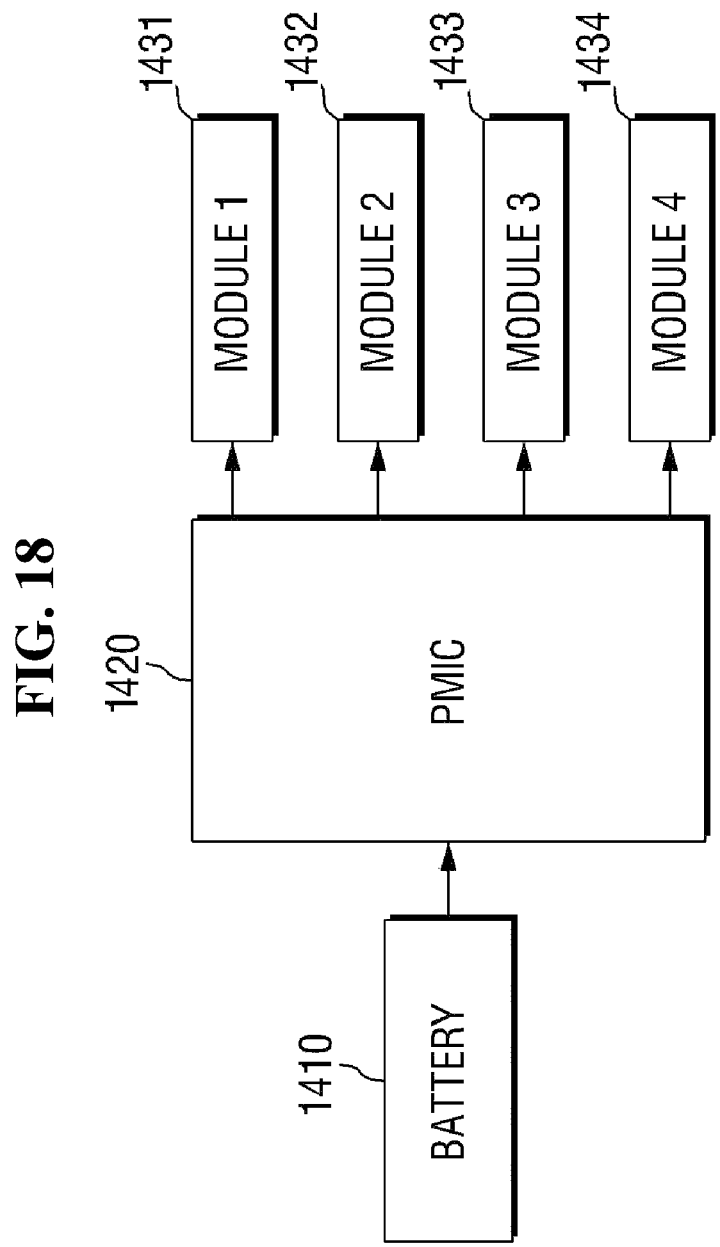
FIG. 18 is a block diagram of a semiconductor system according to the present inventive concept.

FIG. 18 illustrates one example of a semiconductor system according to the present inventive concept.

Referring to FIG. 18, the semiconductor system may include a battery 1410, a power management IC (PMIC) 1420, and a plurality of modules 1431 through 1434. The PMIC 1420 receives a voltage from the battery 1410, shifts the received voltage to a desired voltage level for each of the modules 1431 through 1434, and provides the voltage at the desired voltage level to each of the modules 1431 through 1434. The PMIC 1420 includes at least one semiconductor device of described above according to the present inventive concept.

Figure 19:
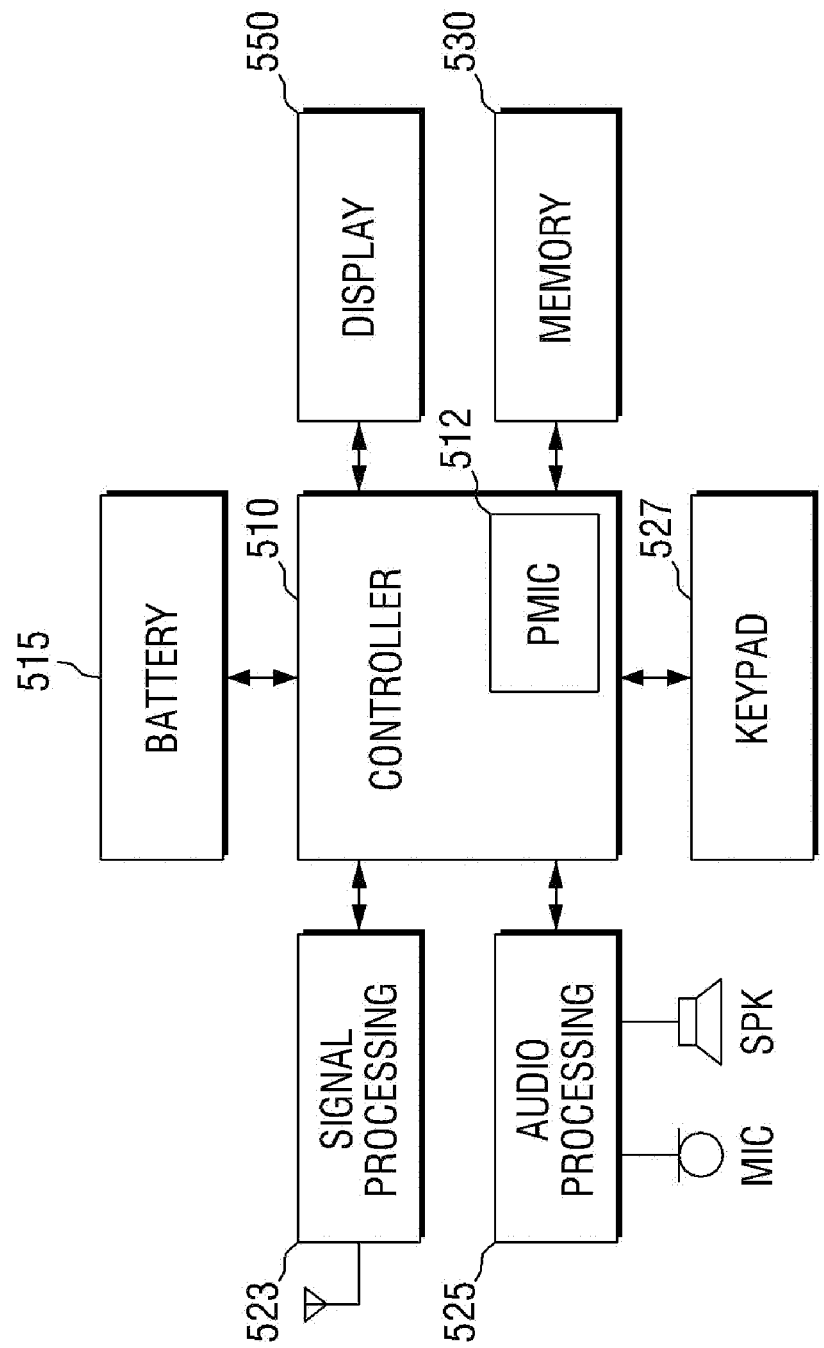
FIG. 19 is a block diagram of another semiconductor system according to the present inventive concept.

FIG. 19 illustrates another example of a semiconductor system according to the present inventive concept Referring to FIG. 19, the semiconductor system may be a portable system. The portable system may include a controller 510, a PMIC 512, a battery 515, a signal processing unit 523, an audio processing unit 525, a memory 530, and a display unit 550.

The semiconductor system may include a keypad 527 having keys for inputting numbers and text information and function keys for setting various functions.

The signal processing unit 523 performs a wireless communication function of the portable system and includes a radio frequency (RF) unit and a modem. The RF unit includes an RF transmitter which raises and amplifies the frequency of a signal to be transmitted and an RF receiver which low-noise amplifies a received signal and lowers the frequency of the received signal. The modem includes a transmitter which encodes and modulates a signal to be transmitted and a receiver which demodulates and decodes a signal received from the RF unit.

The audio processing unit 525 may form codec. The codec may include a data codec and an audio codec. The data codec processes packet data, and the audio codec processes audio signals such as sound and multimedia files. In addition, the audio processing unit 525 converts a digital audio signal received through the modem into an analog signal using the audio codec and reproduces the analog signal or converts an analog audio signal generated by a microphone into a digital audio signal using the audio code and transmits the digital audio signal to the modem. The code may be provided separately or may be stored in the controller 510 of the semiconductor system.

The memory 530 includes a read-only memory (ROM) and a random access memory (RAM). The memory 530 may include a program memory and a data memory. The memory 530 may store programs for controlling the operation of the portable system and data necessary for booting the portable system.

The display unit 550 displays an image signal and user data on the screen or displays data related to calls. The display unit 550 may be a liquid crystal display (LCD) or an organic light-emitting diode (OLED). If the LCD or the OLED is implemented as a touch screen, the display unit 550 may operate as an input unit for controlling the portable system, together with the keypad 527.

The controller 510 controls the overall operation of the portable system. The controller 510 may include the PMIC 512. The PMIC 512 may receive a voltage from the battery 515 and shift the received voltage to a desired voltage level. The PMIC 512 includes at least one semiconductor device described above according to the present inventive concept.

Figure 20:
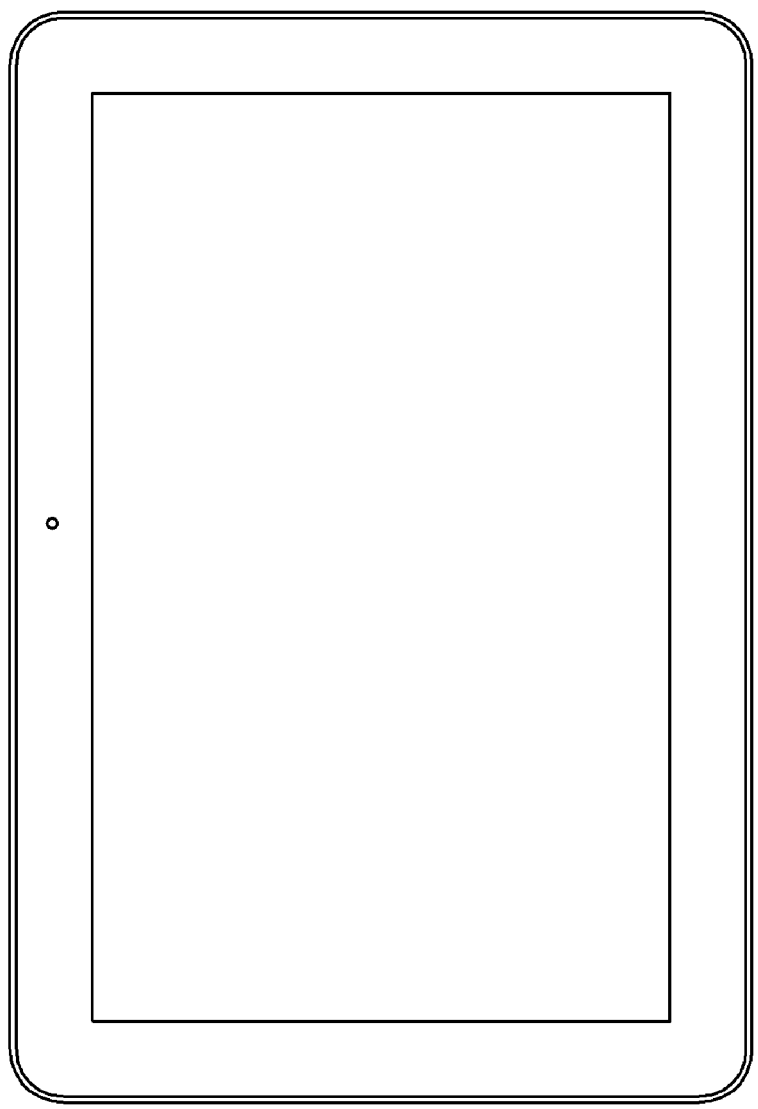

FIGS. 20 and 21 illustrate electronic products to which semiconductor devices according to the present inventive concept can be applied. FIG. 20 illustrates a tablet personal computer (PC), and FIG. 21 illustrates a notebook computer. At least one semiconductor device as described above according to the present inventive concept may be employed by the tablet PC or the notebook computer. It is obvious to those of ordinary skill in the art that semiconductor devices according to the present inventive concept may also be employed by electronic systems and products other than those described above.

Although examples of the present inventive concept have been shown in and described above with reference to the attached drawings, it will be apparent to those skilled in the art that modifications and variations could be made without departing from the spirit and scope of the present inventive concept as defined by the appended claims. Therefore, the disclosed examples should be considered in all respects as illustrative and not restrictive, reference being made to the appended claims rather than to the foregoing description as indicative of the scope of the inventive concept.

What is claimed is:

1. A semiconductor device comprising:
   an active region of semiconductor material projecting upwardly from an upwardly facing surface of a substrate;
   at least one fin extending lengthwise in a first direction on the active region, wherein the active region is wider in a second direction, perpendicular to the first direction, than each said at least one fin;
   field insulation bordering the active region and a lower portion of each said at least one fin, each said at least one fin having an upper portion projecting upwardly beyond an upper surface of the field insulation;
   a gate spacer disposed on the fin, extending in the second direction intersecting to the first direction and defining a trench;
   a gate insulating layer along a sidewall and a bottom surface of the trench;
   a gate electrode disposed on the substrate, filing the trench, extending in the second direction, and intersecting the upper portion of each said at least one fin;
   a source region of a first conductivity type and disposed on one side of the gate electrode;
   a drain region of the first conductivity type and disposed on an other side of the gate electrode;
   a body region of a second conductivity type, wherein the body region extends within a fin pattern under the source region and around the source region as viewed in plan;
   a field dispersion region of the second conductivity type, at least part of the field dispersion region being situated within the fin pattern in the first direction, and said at least part of the field dispersion region being interposed between the gate electrode and the drain region as viewed in plan; and
   a drift region of the first conductivity type, situated within the fin pattern under the drain region and the field dispersion region, and extending around the drain region and the field dispersion region as viewed in plan.

2. The semiconductor device of claim 1, wherein the active region and the at least one fin are constituted by a substrate of semiconductor material,
   the substrate has a first trench therein delimiting the active region and a second trench therein contiguous with the first trench and delimiting the at least one fin,
   the first trench extends more deeply into the substrate than the second trench from an upper surface of the at least one fin, and
   the field insulation occupies respective parts of the first and second trenches, borders the lower portion of each said at least one fin, and has an upper surface beyond which the upper portion of each said at least one fin projects.

3. The semiconductor device of claim 2, wherein the field dispersion region is situated within respective parts of the lower and upper portions of the at least one fin.

4. The semiconductor device of claim 1, wherein the field dispersion region has a first portion, and a second portion which contains a higher concentration of impurities than the first portion, and an entirety of the second portion is situated within the first portion.

5. The semiconductor device of claim 1, wherein the field dispersion region has a first portion, and a second portion which contains a higher concentration of impurities than the first portion, the second portion of the field dispersion region overlaps the gate electrode as viewed in plan, and part of the second portion is situated within the first portion.

* * * * *